United States Patent [19]

Ishida et al.

[11] Patent Number: 4,523,329
[45] Date of Patent: Jun. 11, 1985

[54] FM RECEIVER

[75] Inventors: Kohji Ishida; Tatsuo Numata; Masaharu Sakamoto, all of Tokyo, Japan

[73] Assignee: Pioneer Electronic Corporation, Tokyo, Japan

[21] Appl. No.: 529,781

[22] Filed: Sep. 6, 1983

[30] Foreign Application Priority Data

Sep. 4, 1982 [JP] Japan .................................. 57-154224

[51] Int. Cl.³ .............................................. H04H 5/00
[52] U.S. Cl. ........................................ 381/3; 329/112; 329/124
[58] Field of Search .......................... 381/1, 2, 3, 4, 5; 455/205, 207, 208, 209, 210, 214, 216; 329/112, 122, 124

[56] References Cited

U.S. PATENT DOCUMENTS 4,063,042 12/1977 Mallon .................................... 381/4
4,117,410 9/1978 Bender ................................. 455/208

Primary Examiner—Forester W. Isen
Attorney, Agent, or Firm—Sughrue, Mion, Zinn, Macpeak & Seas

[57] ABSTRACT

An FM receiver comprising a 90 degree phase shifter 21 of the FM signal and a first multiplier 22 for multiplying the FM signal and the phase shifted signal to produce a main signal L+R and a second multiplier 6 for multiplying the FM signal, the phase shifted signal and a subcarrier wave of 38 kHz to produce a sub-signal L−R.

8 Claims, 14 Drawing Figures

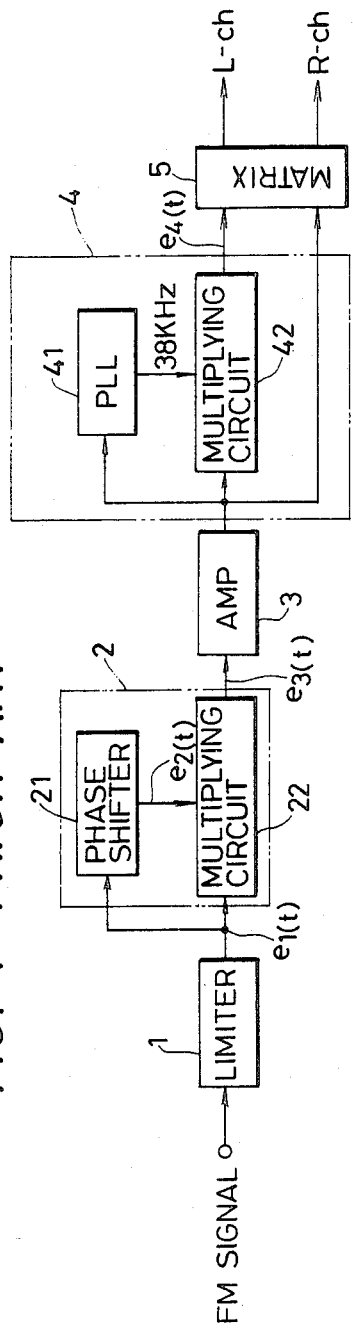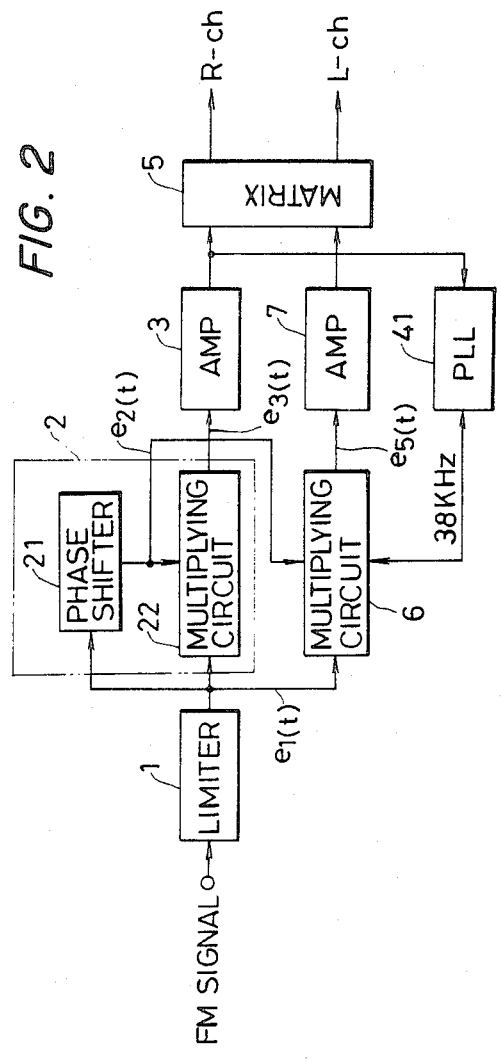

FM RECEIVER

BACKGROUND OF THE INVENTION

The present invention relates to an FM receiver having a quadrature FM detecting circuit.

FIG. 1 is a schematic block diagram of a prior art FM receiver having a quadrature FM detecting circuit, in which the excess of an amplitude component of an input FM signal is eliminated by a limiter 1 and then the FM signal is inputted to a quadrature detecting circuit 2. The detecting circuit 2 comprises a phase shifter 21 and a multiplier 22. The phase shifter 21 is arranged to have an amount of phase shift corresponding to the instantaneous frequency of the FM signal. This is accomplished by having the phase shift amount to be 90 degrees with respect to the center frequency of the FM signal (the FM—IF signal frequency of 10.7 MHz). A multiplication of the output of the phase shifter and of the FM signal is performed in the multiplier 22 and the output of the multiplier 22 is amplified in an amplifier 3 so as to form a stereo composite signal.

In order to derive a sub-signal (the difference between the left and right channel signals) from the stero composite signal, there is provided a sub-signal demodulating circuit 4 which comprises a phase-locked loop (PLL) circuit 41 and a multiplier 42. The PLL circuit 41 produces a subcarrier signal of 38 kHz which is synchronized with a stereo pilot signal. The subcarrier signal is multiplied in the multiplier 42 by the stereo composite signal produced by the amplifier 3. The output of the multiplier 42 and the output of the amplifier 3 are applied to a matrix circuit 5 from which left and right channel signals are derived separately from each other.

In such an arrangement, assume now that the FM signal at the output of the limiter 1 is expressed by the following equation for the sake of simplification:

$$e_1(t) = \sin \omega t \quad (1)$$

Then the signal $e_2(t)$ after passed through the phase shifter 21 is expressed as follows:

$$e_2(t) = A(\omega) \sin \{\omega t + \phi(\Phi)\} \quad (2)$$

where $A(\omega)$ designates the frequency characteristic and $\phi(\omega)$ the phase characteristic. Accordingly, the output $e_3(t)$ of the multiplier 22 is expressed as follows:

$$e_3(t) = e_1(t) \cdot e_2(t) \\ = \tfrac{1}{2} A(\omega) [\cos\phi(\omega) - \cos \{2\omega t + \phi(\omega)\}] \quad (3)$$

In this case, the gain of the multiplier 22 is assumed to be unity.

By causing the signal $e_3(t)$ expressed by equation (3) to pass through a low pass filter (LPF) to eliminate the second term of equation (3), the first term alone can be derived as a detection output. That is, a signal $\cos\phi(\omega)$ having an amount of phase shift $\phi(\omega)$ corresponding to the instantaneous angular frequency $\omega$ of the FM signal $e_1(t) = \sin\omega t$ derived from the quadrature detecting circuit 2. The amount of phase shift is set such that it becomes $\phi(\omega_o) = \pi/2$ with respect to the center frequency $\omega_o$ of the FM signal and the detector output at that time becomes $\cos\phi(\omega_o) = 0$. Therefore a detector output can be obtained proportional to $\pm\Delta\omega$ with respect to $\omega_o \pm \Delta\omega$.

The thus obtained detector output is a so-called stereo composite signal and expressed as follows:

$$e_3(t) = (L+R) + (L-R)\sin\omega_s t + P \sin(\omega_s/2)t \quad (4)$$

where L and R are left and right channel signals respectively, $\omega_s$ is the angular frequency of the subcarrier signal (here equal to 38 kHz), and P the amplitude of the stereo pilot signal. In order to obtain the sub-signal (L−R) from this stereo composite signal $e_3(t)$ a multiplication on the output $\sin\omega_s t$ of the PLL circuit 41 and the $e_3(t)$ of the multiplier 42 is as follows:

$$e_4(t) = e_3(t) \cdot \sin\omega_s t \\ = (L+R)\sin\omega_s t + \tfrac{1}{2}(L-R) - \tfrac{1}{2}(L-R)\cos 2\omega_s t + \\ P \sin\frac{\omega_s}{2} t \cdot \sin\omega_s t \quad (5)$$

In equation (5), the audio component is (L−R) which means that the sub-signal is demodulated. Thus, the main signal (L+R) in the composite signal and the sub-signal in the equation (5) are subject to addition and subtraction in the matrix circuit 5 so as to produce the left and right channel signals.

Such an arrangement requires demodulating processing in two stages in which a stereo composite signal $e_3(t)$ is obtained first in the quadrature detecting circuit 2 and then a sub-signal $e_4(t)$ is demodulated from the composite signal $e_3(t)$ and a 38 kHz subcarrier signal. As the result, there is a disadvantage that the signal transmission line becomes lengthy so as to deteriorate the S/N ratio and increase the distortion. Further, in multiplying the composite signal and the subcarrier signal, a method is employed in which the composite signal is subject to switching by using a rectangular wave of 38 kHz for the sake of simplification of the circuit. There is another disadvantage in this case that there may occur a beat of the odd order high harmonics of the retangular 38 kHz wave and a signal of a nearby broadcasting station, resulting in beat interference.

SUMMARY OF THE INVENTION

The present invention is intended to eliminate such drawbacks in the prior art as mentioned above. An object of the invention is to provide an FM receiver in which the signal transmission line is shortened and beat interference is prevented.

The FM receiver according to the present invention is distinguished by the feature that a quadrature detecting circuit is used for demodulating a main signal so that a multiplying circuit is separately provided for multiplying the output of a phase shifter of the quadrature detecting circuit with both an FM signal and a subcarrier signal of 38 kHz so as to derive a sub-signal from an output of the multiplier.

BRIEF DESCRIPTION OF THE DRAWINGS

FIG. 1 is a schematic block diagram of a conventional FM receiver;

FIG. 2 is a block diagram showing the principle of the present invention;

DETAILED DESCRIPTION OF THE PREFERRED EMBODIMENTS

Figure 3:
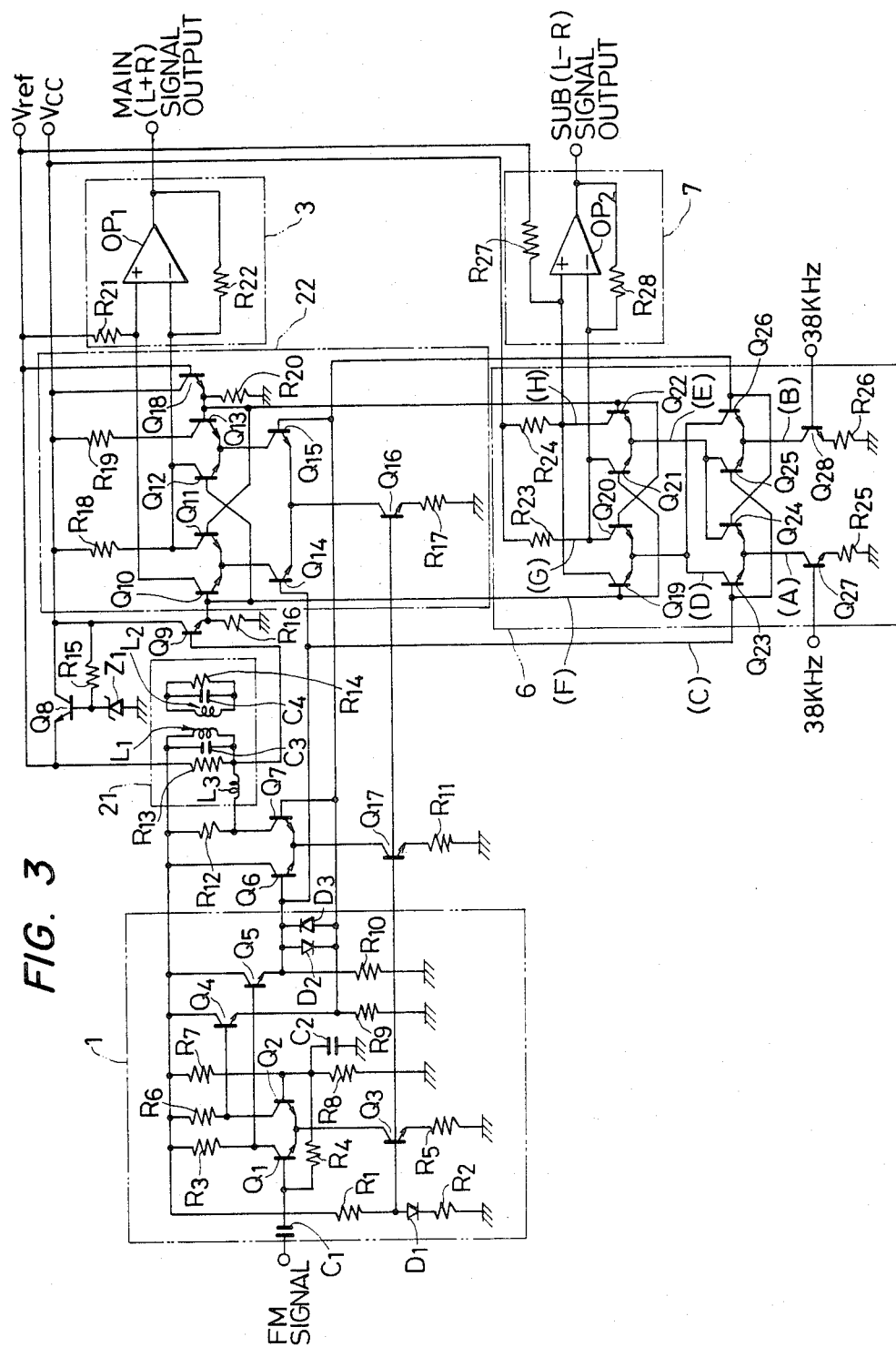
FIG. 3 is a particular circuit diagram according to an embodiment of the present invention.

Referring to the drawings, the present invention will hereafter be described in detail.

FIG. 2 is a block diagram showing the principle of the invention in which a part similar to that in FIG. 1 is designated by the same reference numeral. The FM signal passes through a limiter 1 and is applied to a quadrature detecting circuit 2 for demodulation of a main signal (L+R). The circuit 2 is equivalent to the quadrature detecting circuit 2 shown in FIG. 1 and an output of the detecting circuit 2 is applied to a matrix circuit 5 through an amplifier 3.

A further triple multiplying circuit 6 is provided for the demodulation of a sub-signal (L−R) so that in the circuit 6 multiplication is performed to obtain the product of the FM signal, the output of a phase shifter 21 and a sinusoidal wave subcarrier of 38 kHz. The subcarrier is obtained by a PLL circuit 41 by extracting a stereo pilot signal out of a stereo composite signal produced by the amplifier 3. The output of the multiplying circuit 6 is applied to the matrix circuit 5 through another amplifier 7.

In such an arrangement, assume now that the FM signal is expressed by $e_1(t)$ of equation (1) and the output of the phase shifter 21 by $e_2(t)$ of equation (2). Then the output $e_3(t)$ of the quadrature detecting circuit 2 is expressed by equation (3), similarly to the previous case. The quantity $e_3(t)$ is alternately expressed by equation (4) to explicitly contain the main signal (L+R).

In multiplying circuit 6, the multiplication is performed on $e_1(t)$, $e_2(t)$ and $\sin\omega_s t$. The output $e_5(t)$ of the muliplying circuit 6 is expressed as follows:

$$e_5(t) = e_1(t) \cdot e_2(t) \cdot \sin\omega_s t$$
$$= e_3(t) \cdot \sin\omega_s t \qquad (6)$$

Substituting equation (4) into equation (6), the following equation is obtained:

$$e_5(t) = \{(L+R) + (L-R)\sin\omega_s t + P\sin\omega_s/2t\}.$$
$$\sin\omega_s t = \tfrac{1}{2}(L-R) + (L+R)\sin\omega_s t \qquad (7)$$
$$-\tfrac{1}{2}(L+R)\cos 2\omega_s t = P\sin\omega_s/2t \cdot \sin\omega_s t.$$

In this equation, since the audio component is $(L-R)$, the sub-signal is thus demodulated.

FIG. 3 is a diagram of a particular circuit according to an embodiment of the present invention, in which an FM signal is inputted to a limiter 1 comprising a differential amplifier. Typically, the limiter 1 is constituted by differential transistors Q1 and Q2, emitter follower transistors Q4 and Q5, and diodes D2 and D3, while a transistor Q3, a diode D1 and resistors R1, R2 and R5 constitute a current source for the differential transistors Q1 and Q2. Resistors R3 and R6 serve as load resistors for the differential transistors Q1 and Q2, respectively, while resistors R9 and R10 serve as emitter resistors for the emitter follower transistors Q4 and Q5. Resistors R4, R7 and R8 serve to provide bias for the differential transistors Q1 and Q2.

Transistors Q6, Q7 and Q17 and a resistor R11 constitute a differential amplifier which serves as a drive amplifier for a phase shifter 21 at the next stage. An FM signal is derived from across a resistor R12 and applied to the phase shifter 21 which is constituted by coils L1, L2 and L3, capacitors C3 and C4 and resistors R13 and R14. The output of the phase shifter 21 is applied to multipliers 22 and 6 through a buffer comprising a transistor Q9 and a resistor R16. The multiplier 22 comprises a so-called double-balance type differential amplifier which is constituted by transistors Q10 and Q15. The FM signal is applied across the respective base of the transistors Q14 and Q15, while the output of the phase shifter 21 is applied across the common base junction of the transistors Q10, Q12 and the common base junction of the transistors Q11 and Q13. A current source is constituted by a transistor Q16 and a resistor R17, while a base bias for the transistors Q11 and Q13 is provided by a transistor Q18 and a resistor R20. A quadrature detector output is derived from across the ends of the series connection of resistors R18 and R19 and applied to an amplifier 3.

The amplifier 3 comprises an operational amplifier OP1 and resistors R21 and R22. The output of the amplifier 3 includes a main signal (L+R) as an audio component thereof. Further, a transistor Q8, a diode Z1 and a resistor R15 constitute a constant voltage source which serves as a power supply for the limiter 1 and the phase shifter 21.

The multiplier 6 for detecting a sub-signal comprises two double-balance type differential amplifiers. A first one of the double-balance type differential amplifiers is constituted by transistors Q19 and Q22 and is supplied at its input with the output (F) of the phase shifter 21, while a second double-balance type differential amplifier is constituted by transistors Q23 to Q26 and supplied with the FM signal (C) at its input. Transistors Q27 and Q28 and resistors R25 and R26 constitute a circuit which serves as a current source for the second double-balance type differential amplifier. A positive and opposite phase signal of a sinusoidal wave subcarrier of 38 kHz are respectively supplied to the bases of the transistors Q27 and Q28. Accordingly, the respective collector current outputs (A) and (B) of the transistors Q27 and Q28 vary in accordance with the subcarrier. The outputs (D) and (E) of the second double-balance type differential amplifier are supplied to the first double-balance type amplifier as its current source. The outputs (G) and (H) of the first double balance type amplifier are amplified by an amplifier 7 and derived therefrom as sub-signal (L−R). The amplifier 7 is constituted by an operational amplifier OP2 and resistors R27 and R28.

Figure 4A:
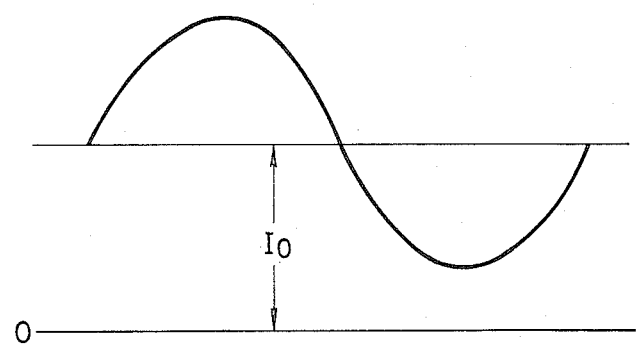
FIGS. 4A through 4H show waveforms of the circuit of FIG. 3 in operation.
Figure 4B:
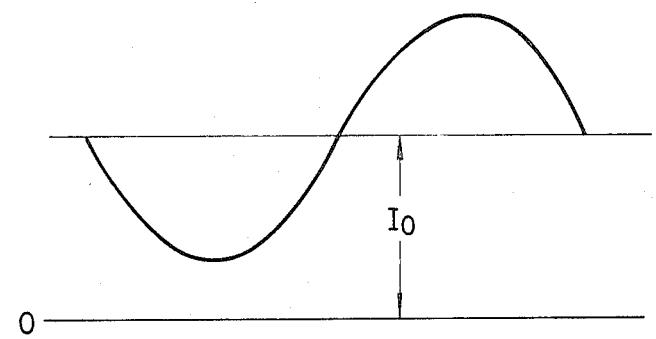
Figure 4C:
Figure 4D:
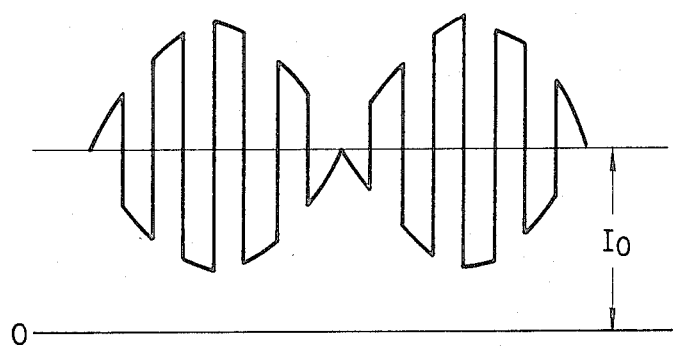
Figure 4E:
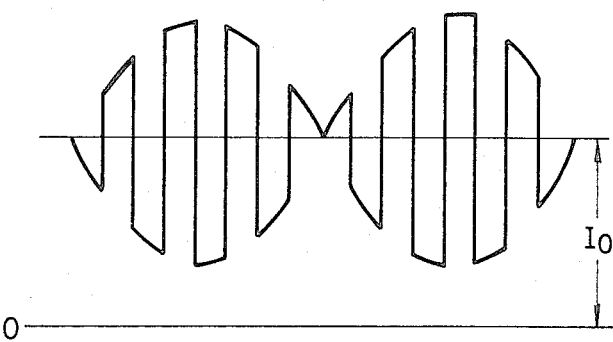
Figure 4F:
Figure 4G:
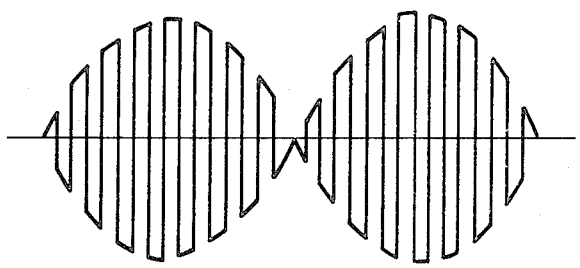
Figure 4H:
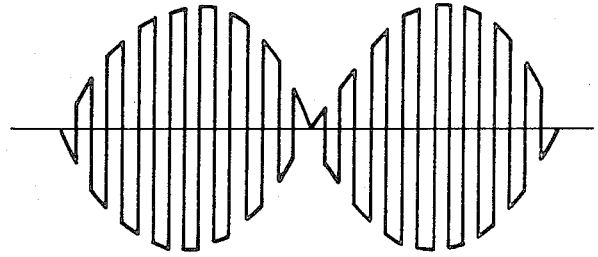

The waveforms of the signals (A) and (H) at the various parts of the multiplier 6 of FIG. 3 are correspondingly shown in FIGS. 4(A) to 4(H). As shown in the diagrams (A) and (B), the collector current outputs of the respective transistors Q27 and Q28 form positive sinusodial subcarrier current waves of opposite phase about a constant current value $I_o$. An FM signal as shown in FIG. 4(C) is applied to the input of the second double-balance type differential amplifier and therefore the outputs of the second double-balance type amplifier become equivalent to the waveforms, as shown in diagrams (D) and (E), which are obtained by frequency modulating a 38 kHz subcarrier with the FM signal in a double-side band. Thus, the outputs of the second double-balance type amplifier are the products of the 38 kHz subcarrier and the FM signal (C).

The first double-balance type differential amplifier further multiplies the multiplication outputs (E) and (D) by the phase shifter output (F) and produces its outputs as shown in the diagrams (G) and (H). The waveform of the output (F) of the phase shifter 21 has a phase difference of $\pi/2$ with respect to the waveform of the FM signal (C). Thus, at the outputs (G) and (H), the multiplication signals as expressed by the equations (6) or alternately by equation (7) are obtained. The sub-signal (L−R) can be obtained as the low band component or audio component of (G) or (H).

Figure 5:
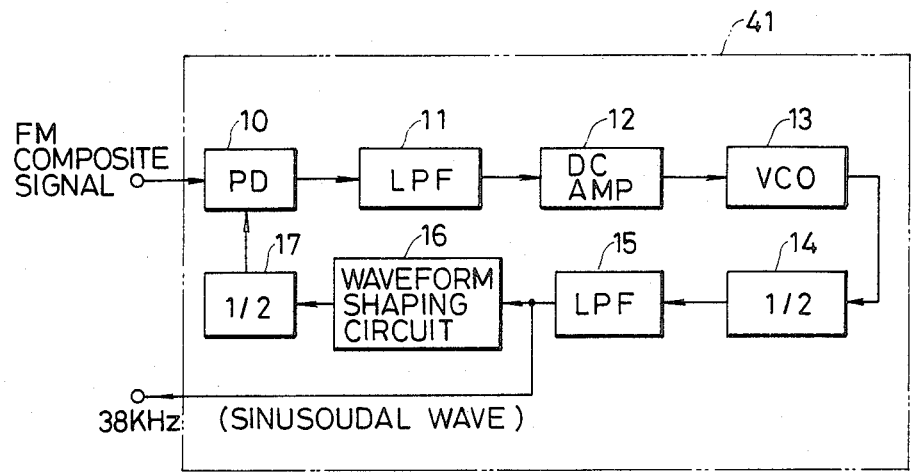
FIG. 5 is a block diagram of the phase-locked loop (PLL) circuit of FIG. 5.

FIG. 5 is a block diagram illustrating an example of the PLL circuit 41 for producing a subcarrier signal, in which an FM composite signal is applied to an input of a phase comparator 10, the output of which is applied as a control signal to a VCO (voltage-controlled oscillator) 13 through an LPF 11 and a DC amplifier 12. The output of the VCO 13 is frequency-divided by a ½ frequency-divider 14 and converted to a 38 kHz sinusoidal wave by an LPF 15. This 38 kHz sinusodial wave is produced as a PLL output and is also applied to a waveform shaping circuit 16 on the other hand. The wave shaping circuit 16 produces a rectangular wave, the frequency of which is then made to be 19 kHz by another ½ frequency divider 17. The output of this frequency divider 17 and the composite signal are phase-compared in the phase comparator 10. Such an arrangement is well known and therefore no detailed description has been made here.

Figure 6:
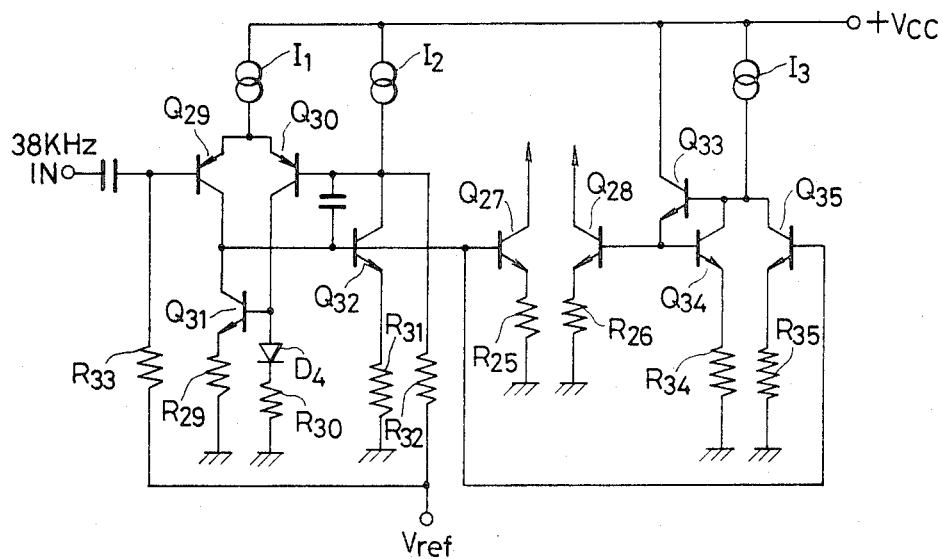
FIGS. 6 and 7 illustrate respective embodiments of a circuit for current-converting the subcarrier signal obtained by the PLL circuit of FIG. 5.
Figure 7:
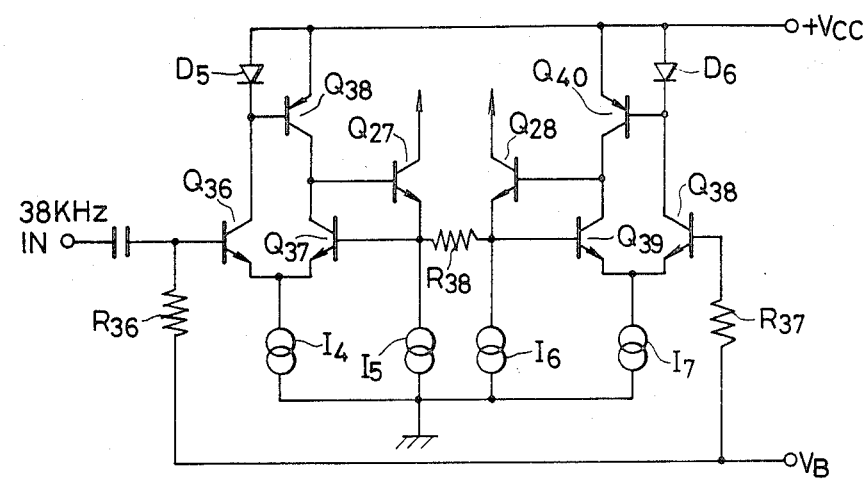

FIGS. 6 and 7 show embodiments of particular circuits in which the 38 kHz subcarrier produced by the PLL circuit 42 as described in FIG. 5 is converted into a subcarrier current. Referring to FIG. 6, the subcarrier signal is inputted to a differential amplifier constituted by transistors Q29 and Q30 and a current source I1 so as to be converted into a current which is derived as a current output from a current Miller load constituted by a transistor Q31, a diode D4 and resistors R29 and R30. The current output is then inputted to the base of the current source transistor Q27, also shown in FIG. 3. The base of the transistor Q30 is driven by a circuit constituted by a transistor Q32, a resistor R31 and a current source I2. Resistors R32 and R33 serve to provide the bias for the bases of the transistors Q29 and Q30. The collector output of the transistor Q29 is applied to a differential amplifier comprising transistors Q33, Q34 and Q35, a current source I3, and resistors R34 and R35. The emitter output of the transistor Q33 is inputted to the base of the current source transistor Q28, also shown in FIG. 3.

Referring to the alternate embodiment of FIG. 7, the 38 kHz subcarrier is current-converted by a differential amplifier constituted by transistors Q36 and Q37 and a current source I4. The output is derived as a current output from a current Miller circuit which is a collector load for the transistor Q37. The thus derived current output is then applied to the current source transistor Q27, also shown in FIG. 3. The current Miller circuit is constituted by a transistor Q38 and a diode D5. Another current source transistor Q28, also shown in FIG. 3, at the opposite phase side is driven by another differential amplifier constituted by transistors Q38 and Q39 and a current source I7. A current Miller circuit constituted by a transistor Q40 and a diode D6 is provided as a collector load for this differential amplifier. I5 and I6 are emitter current sources for the transistors Q27 and Q28 respectively, and resistors R36 and R37 serve to provide bias for the bases of the transistors Q36 and Q38, respectively.

It should be understood that the embodiments shown in FIGS. 2, 6 and 7 are only by way of example and the invention is not, of course, limited to such embodiments but includes various modifications and equivalents of such embodiments.

As described above, the FM receiver according to the present invention is advantageous for the following reasons. Since the main and sub-signals can be demodulated in parallel, the length of the signal transmission line can be decreased in comparison with the conventional case to thereby reduce the deterioration in S/N ratio as well as the distortion. Further, since the demodulation is performed equivalently by linear or analog multiplicative processing with the 38 kHz sinusoidal subcarrier, problem such as beat interference with a nearby broadcasting station caused by the switching of the 38 kHz rectangular wave can be eliminated.

We claim:

1. An FM receiver, comprising:
   a phase shifter (21) for shifting the phase of an incoming FM signal by an amount corresponding to the frequency of said FM signal;
   a first multiplier (22) for multiplying said incoming FM signal and the output of said phase shifter, thereby producing a main signal (L+R);
   a generator of an FM subcarrier wave; and
   a second multiplier (6), connected in parallel with said first multiplier, for multiplying said FM signal, the output of said phase shifter, and the output of said generator thereby producing a subsignal (L−R).

2. An FM receiver, as recited in claim 1, wherein said phase shifter shifts the phase by 90 degrees of a center FM frequency ($\omega_o$).

3. An FM receiver, as recited in claim 1, wherein said generator is a phase-locked loop (41) connected to the output of said first multiplier.

4. An FM receiver, as recited in claim 1, further comprising a matrix circuit (5) connected to the outputs of said first and second multipliers for separating left and right signals (L,R).

5. An FM receiver, as recited in claim 3, further comprising a matrix circuit (5) connected to the outputs of said first and second multipliers for separating left and right signals (L,R).

6. An FM receiver, as recited in claim 1, further comprising a limiter (1) for limiting the amplitude of said FM signal.

7. An FM receiver, as recited in claim 5, further comprising a limiter (1) for limiting the amplitude of said FM signal.

8. An FM receiver, as recited in claim 6, wherein said phase-locked loop produces a subcarrier wave substantially at a frequency of 38 kHz.

* * * * *